United States Patent
Holm et al.

[11] Patent Number: 5,751,159
[45] Date of Patent: May 12, 1998

[54] SEMICONDUCTOR ARRAY AND SWITCHES FORMED ON A COMMON SUBSTRATE FOR ARRAY TESTING PURPOSES

[75] Inventors: Paige M. Holm, Phoenix; Chris Terwilliger, Tempe, both of Ariz.

[73] Assignee: Motorola, Inc., Schaumburg, Ill.

[21] Appl. No.: 523,327

[22] Filed: Sep. 5, 1995

[51] Int. Cl.$^6$ .............................. G01R 31/00; G01R 31/26
[52] U.S. Cl. ................................. 324/767; 324/765
[58] Field of Search ............................ 324/770, 765, 324/158.1, 73.1, 767, 763, 750, 752, 768, 769; 359/54; 345/84; 437/8, 23, 127; 438/14, 18; 257/40, 48

[56] References Cited

U.S. PATENT DOCUMENTS

| | | | |
|---|---|---|---|
| 3,609,546 | 9/1971 | Magnusson et al. | 324/767 |
| 3,956,698 | 5/1976 | Malmberg et al. | 324/752 |
| 4,843,312 | 6/1989 | Hartman et al. | 324/770 |
| 4,952,031 | 8/1990 | Tsunoda et al. | 359/54 |
| 5,237,314 | 8/1993 | Knapp | 340/783 |
| 5,377,030 | 12/1994 | Suzuki et al. | 324/770 |
| 5,444,390 | 8/1995 | Bartlett et al. | 324/770 |
| 5,506,516 | 4/1996 | Yamashita et al. | 324/770 |
| 5,546,013 | 8/1996 | Ichioka et al. | 324/770 |

Primary Examiner—Vinh P. Nguyen
Attorney, Agent, or Firm—Eugene A. Parsons

[57] ABSTRACT

A high resolution device array with optical probe and method of probing the array is disclosed, including providing on the array substrate an externally activated switch for each row and each column in the array. The switches are connected together into a row circuit and a column circuit on the substrate. The complete array is probed by connecting an external power circuit to the row and column circuits and, using external light sources, such as lasers, to address and activate each device in the array.

19 Claims, 2 Drawing Sheets

SEMICONDUCTOR ARRAY AND SWITCHES FORMED ON A COMMON SUBSTRATE FOR ARRAY TESTING PURPOSES

FIELD OF THE INVENTION

The present invention pertains to high resolution arrays of devices and more specifically to methods and apparatus for probing such high resolution arrays.

BACKGROUND OF THE INVENTION

One of the greatest challenges currently facing programs fabricating and utilizing large and/or high resolution light emitting diode arrays, is the on-wafer qualification of the arrays. Generally, the on-wafer qualification consists of screening the arrays to ensure that all rows and columns are addressable, and pixel yield within the array meets specifications. This type of on-wafer screening is needed until either the wafer yield reaches sufficiently high levels or the cost of mounting the arrays onto a substrate before testing becomes sufficiently low, and after these qualifications are reached, some on-wafer screening is desirable.

Prior art probing schemes consist of contacting each of the I/O pads on an array chip with an individual probe needle, or in some less stringent tests every other I/O pad, with all of the needles being carried in a single probe card. There are at least a couple of major drawbacks with this approach. High resolution arrays include hundreds of light emitting devices in each row and each column, usually something in excess of 400 devices in each column and 600 devices in each row. Further, these numbers are increasing very rapidly as the various technologies utilized (e.g. semiconductor technology) are improved. Because of the very high I/O pad count on the array chips, the probe card is very expensive and tends to require a large amount of maintenance (e.g. cleaning, probe alignment, and planarization). Also, because the high density (small pads and tight pitch) of the I/O pads at the array chip perimeter, wafer alignment is very intolerant, making the process tedious, time consuming, and difficult to automate.

Thus, it would be highly advantageous to devise new probing methods and apparatus.

Accordingly, it is a purpose of the present invention to provide new and improved apparatus and testing methods for high resolution device arrays.

It is another purpose of the present invention to provide new and improved apparatus and testing methods for high resolution device arrays which are relatively simple and inexpensive.

It is still another purpose of the present invention to provide new and improved apparatus and testing methods for high resolution device arrays which results in reliable, repeatable, high throughput on-wafer testing.

It is a further purpose of the present invention to provide new and improved apparatus and testing methods for high resolution device arrays which are adaptable to automation.

SUMMARY OF THE INVENTION

The above problems and others are at least partially solved and the above purposes and others are realized in a high resolution device array with optical probe and method of probing the array, including providing on the array substrate an externally activated switch for each row and each column in the array. The switches are connected together into a row circuit and a column circuit on the substrate. The complete array is probed by connecting an external power circuit to the row and column circuits and, using external light sources, such as lasers, to address and activate each device in the array.

In a preferred embodiment, a plurality of photodiodes is fabricated on the substrate with the array of devices. One each of the plurality of photodiodes is associated with each row and each column of devices. One terminal of each photodiode associated with the rows is connected, in series with an I/O pad, to the associated row and the other terminal is connected to the other terminal of each of the other photodiodes associated with the rows and to a row connection pad. Similarly, one terminal of each photodiode associated with the columns is connected, in series with an I/O pad, to the associated column and the other terminal is connected to the other terminal of each of the other photodiodes associated with the columns and to a column connection pad.

Each device in the array can easily be addressed by actuating the row and column photodiodes with a light source, such as a pair of lasers or the like (one for the row and one for the column). When not activated, the photodiodes have no effect on the array and the array can be bump bonded, for example, to driver circuits and the like by means of the I/O pads.

BRIEF DESCRIPTION OF THE DRAWINGS

Referring to the drawings.

DESCRIPTION OF THE PREFERRED EMBODIMENTS

Figure 1:
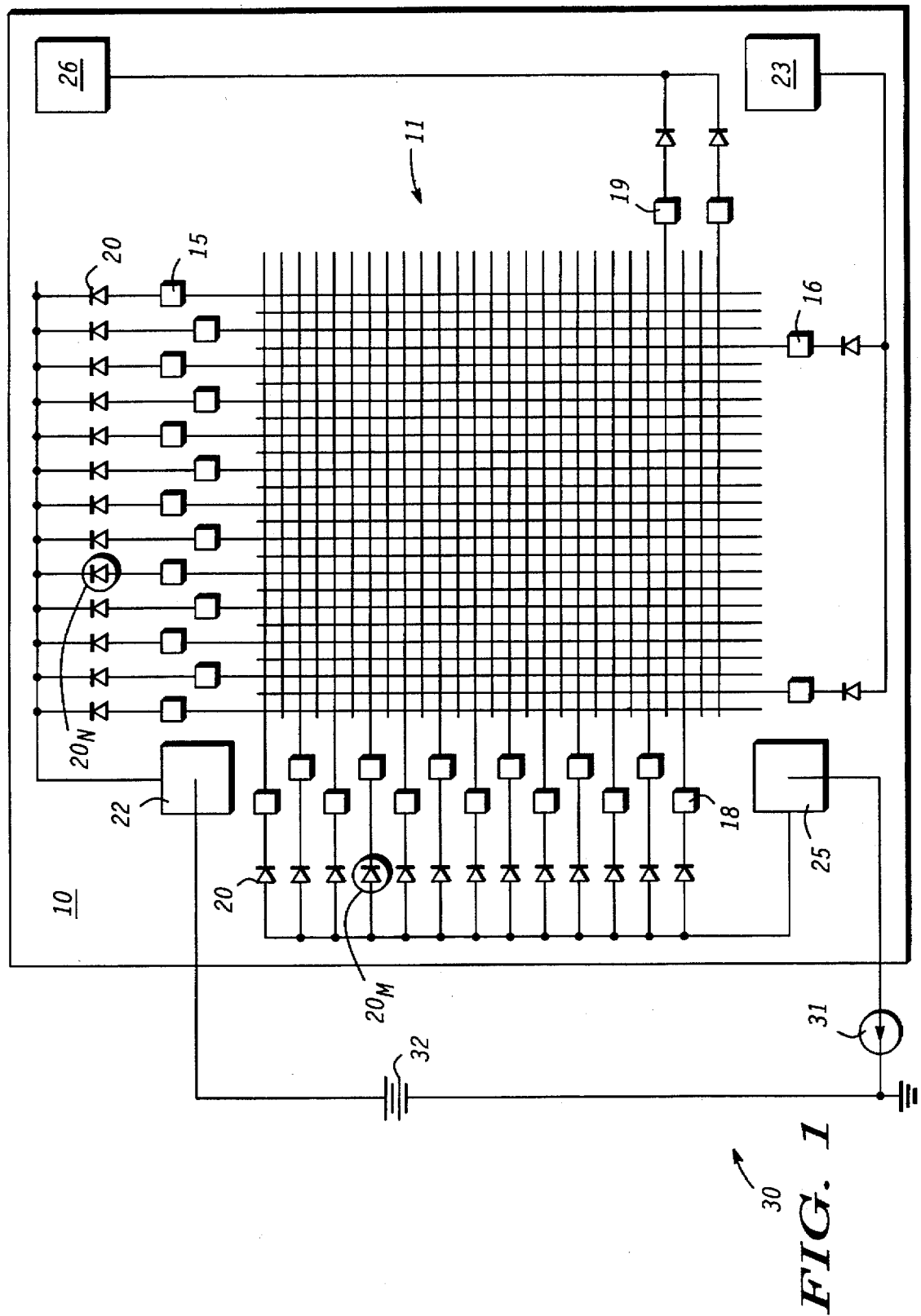
FIG. 1 is a simplified schematic diagram of a device array having an optical probe in accordance with the present invention.

Referring specifically to FIG. 1, a substrate 10 is illustrated having an array 11 of devices positioned on substrate 10 with electrodes connected into rows and columns for the addressing and activation of the devices. For example, array 11 can include light emitting devices (e.g. semiconductor or organic light emitting diodes, LCDs, FEDs, semiconductor lasers, etc.), or a diode or other device array for some purpose such as a memory, or three (or more) electrode devices having two control electrodes (e.g. a base or gate and an emitter) connected into an array. In this specific embodiment light emitting diodes are used and will be described for purposes of explanation only.

Every other column of interconnected device terminals is connected to an I/O pad 15 at one side (the top in FIG. 1) of array 11, while alternate columns of interconnected device terminals are connected to I/O pads 16 at an opposed side (the bottom in FIG. 1) of array 11. Similarly, every other row of interconnected device terminals is connected to an I/O pad 18 at one side (the left in FIG. 1) of array 11, while alternate rows of interconnected device terminals are connected to I/O pads 19 at an opposed side (the right in FIG. 1) of array 11. As is known and understood by those skilled in the art, placing I/O pads around the entire periphery of array 11 doubles the pitch and allows the entire structure to be spread more evenly on substrate 10. Also, I/O pads 15, 16, 18, and 19 are constructed to make external contact thereto and for mounting substrate 10 on a circuit board or the like, as for example by bump bonding.

Each I/O pad 15, 16, 18, and 19 further has an externally activated switch fabricated on substrate 10 and connected thereto. The externally activated switches are any switch that can be individually activated (turned on or off) by an external source of energy (e.g. light, magnetics, or other radiation). The basic characteristic is that the switch must block current flow under reverse bias in the absence of activation, and they must readily conduct required current levels when activated. In the present embodiment, and for purposes of explanation only, the externally activated switches are photodiodes 20. When light is the chosen radiation for activation of the switches, various light detectors can be utilized, such as Schottky photodiodes, pn photodiodes, or photoconductive devices. The reasons for using pn photodiodes 20 in this embodiment will be explained in more detail presently.

Referring again to FIG. 1, each photodiode 20 has a first terminal connected to an I/O pad associated with a row or column. All of photodiodes 20 connected to I/O pads 15 have a second terminal connected together and to an externally accessible column connection pad 22. All of photodiodes 20 connected to I/O pads 16 have a second terminal connected together and to a second externally accessible column connection pad 23. All of photodiodes 20 connected to I/O pads 18 have a second terminal connected together and to an externally accessible row connection pad 25. All of photodiodes 20 connected to I/O pads 19 have a second terminal connected together and to a second externally accessible row connection pad 26. It will of course be understood that a single column connection pad and a single row connection pad could be utilized by providing additional connections on substrate 10, if desired and convenient. Also, all of the column photodiodes could be located along a single edge or in a convenient area and all of the row photodiodes could be located along a single edge or in a convenient area.

For reasons that will be apparent presently, all of photodiodes 20 associated with the columns of array 10 have an anode connected to I/O pad 15 or 16 of the column with which it is associated and a cathode connected to all of the other photodiodes 15 or 16. All of photodiodes 20 associated with the rows of array 10 have a cathode connected to I/O pad 18 or 19 of the row with which it is associated and an anode connected to all of the other photodiodes 18 or 19. The orientation of photodiodes 20 with respect to I/O pads 15, 16 and 18, 19 is opposite for columns and rows such that each photodiode 20 acts to block current flow from the column through the addressed device in the array and out the row interconnect, or vice versa if desired.

To perform a test, or probe, of array 11, column connection pads 22 and 23 and row connection pads 25 and 26 are connected into an external testing circuit 30. It will of course be understood that only one column (22 or 23) and one row connection pad (25 or 26) can be utilized at a time, if desired, or all four can be included in circuit 30. For purposes of this explanation only column connection-pad 22 and row connection pad 25 are utilized. Circuit 30 includes a fixed current source 31 connected to conduct current flow from row connection pad 25 to a return, or ground. An external voltage source 32 is optionally connected between column connection pad 22 and the return, or ground, to adjust bias levels within circuit 30 and to complete circuit 30.

An external activating energy source (not shown) is directed onto the externally activated switches in the row and column circuits to address each device in matrix 11. In the present specific embodiment a first focused light beam is utilized to actuate column photodiodes 20 and a second focused light beam is utilized to actuate row photodiodes 20. The light beams can be generated by a laser, or other light source. In this embodiment, a laser is used and the wavelength of this excitation is such that it is absorbed by the structure of each photodiode 20. In the present example, for an array 11 emitting at 605 nm, the wavelength of the laser should be less than about 600 nm. An argon ion laser tuned to about 488 nm or 514 nm lines would suffice. If the coupling of the laser beam to photodiodes 20 is good and the responsivity of photodiodes 20 is at least a few percent, only tens of microwatts of beam power are required.

For purposes of this explanation, assume that the first focused light beam is directed onto photodiode 20 in column N, hereafter referred to photodiode $20_N$ and the second focused light beam is directed onto photodiode 20 in row M, hereafter referred to photodiode $20_M$. Further, in this specific example the devices in array 11 are light emitting diodes (LED). Thus, the LED at the juncture of column N and row M, hereinafter referred to as $LED_{MN}$, is being addressed.

Figure 2:
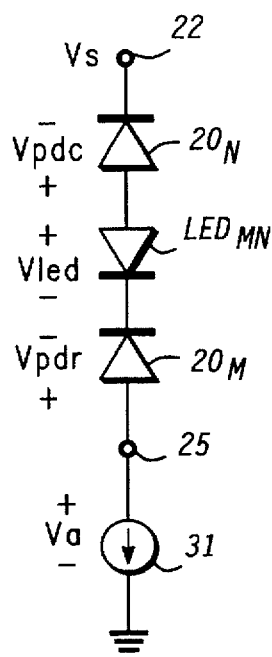
FIGS. 2, 3 and 4 are schematic diagrams of an addressing and testing scheme for single device in the matrix of FIG. 1.
Figure 3:
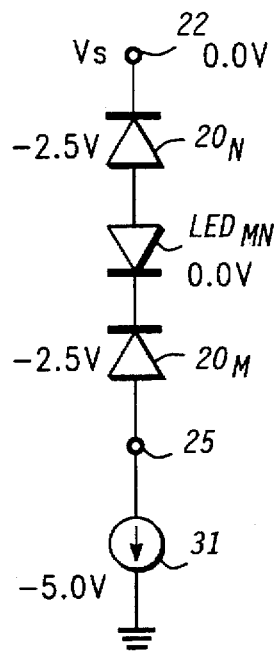
Figure 4:
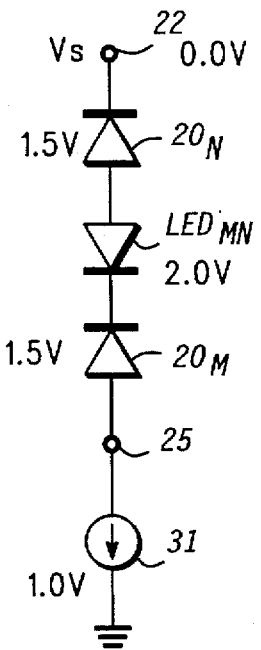

Schematic diagrams illustrated in FIGS. 2–4 have been provided to more easily understand the operation of the structure in FIG. 1. The schematic diagrams of FIGS. 2–4 represent one of the devices (e.g. $LED_{MN}$) of matrix 11 connected in test circuit 30. Referring to FIG. 2, probe 22 is illustrated with the cathode of photodiode $20_N$ connected thereto. The anode of photodiode $20_N$ is connected to the anode of $LED_{MN}$, the cathode of which is connected to the cathode of photodiode $20_M$. The anode of photodiode $20_N$ is connected to a positive terminal of fixed current source 31. In this explanation it is assumed that probe 22 is connected to a zero voltage source, VS, or simply connected to ground.

Referring to FIG. 3, photodiodes $20_N$ and $20_M$ are in the dark, that is, no activating light is applied thereto. Fixed current source 31 is set to the desired pixel drive current, in this example, sufficient current to turn on $LED_{MN}$, or approximately 50 µA. In this state, photodiodes $20_N$ and $20_M$ block current flow through $LED_{MN}$ and the pixel is not lit, or does not generate any light. Referring to FIG. 4, light is directed onto each of photodiodes $20_N$ and 20M. The light directed onto photodiodes $20_N$ and $20_M$ causes photodiodes $20_N$ and $20_M$ to generate a photocurrent sufficient, as restricted by fixed current source 31, to activate $LED_{MN}$. Activation of $LED_{MN}$ causes it to generate light which, in this example, appears as a single pixel of array 11.

In a complete test, as one example, the two focused light beams are steered across the entire extent of the column and row photodiodes, which results in addressing and activating each device in array 11. For example, one focused light beam is retained on the first photodiode in the columns (activating the first column) and the second focused light beam is moved across each of the photodiodes connected to the rows. Thus, each device in the first column is addressed. This procedure is then repeated for the second, third, etc. columns until all of the devices in array 11 have been addressed and activated. Proper operation of each device in the array can be determined by sensing (visually or otherwise) the light generated by the properly activated device, or by sensing the current flow or voltage drops in circuit 31.

In a slightly different testing procedure, the focused light beams are rapidly scanned across the photodiodes to generate an image on array 11. In this example, the image is written one pixel at a time on array 11, and the pixel (LED)

state is controlled by the activation (or non-activation) of current source 31 to which the image data is serially presented. Current source 31, in this instance, is a controllable current source, with the control attached to the image data. Assuming, for example, an array 11 of 240 columns by 144 rows and a frame rate of $f_{frame}$=60 Hz=column scan rate. This means that the data input rate at current source 31 would be:

$$f_{data}=(60)(144)(240)=2.0736 \text{ Mbps},$$

and a row scan rate of:

$$f_{row}=(f_{frame})(144)=(60)(144)=8.64 \text{ KHz}.$$

Gray scale images could also be easily displayed by appropriately modulating the drive current level at current source 31.

The light beam scanning system, in this embodiment, is similar to conventional laser trimming systems widely used in semiconductor IC manufacturing. A major difference is that two scanning beams are used instead of one. Beam scanning may be accomplished with either galvanometers or rotating mirrors. The galvanometers allow fixed beam positions for individual device (pixel) characterization, while the rotating mirror approach is best suited for rastering the beams for displaying complete images.

In somewhat different scanning beam variations, a light source could be directed onto all of the column (or row) photodiodes simultaneously and a single light source could be swept over the row (or column) photodiodes one at a time to activate or illuminate a complete column (or row) of LEDs at a time. In this example, much larger currents are required to activate all of the devices in a column (or row) and current source 31 would be set for much larger currents.

Figure 5:
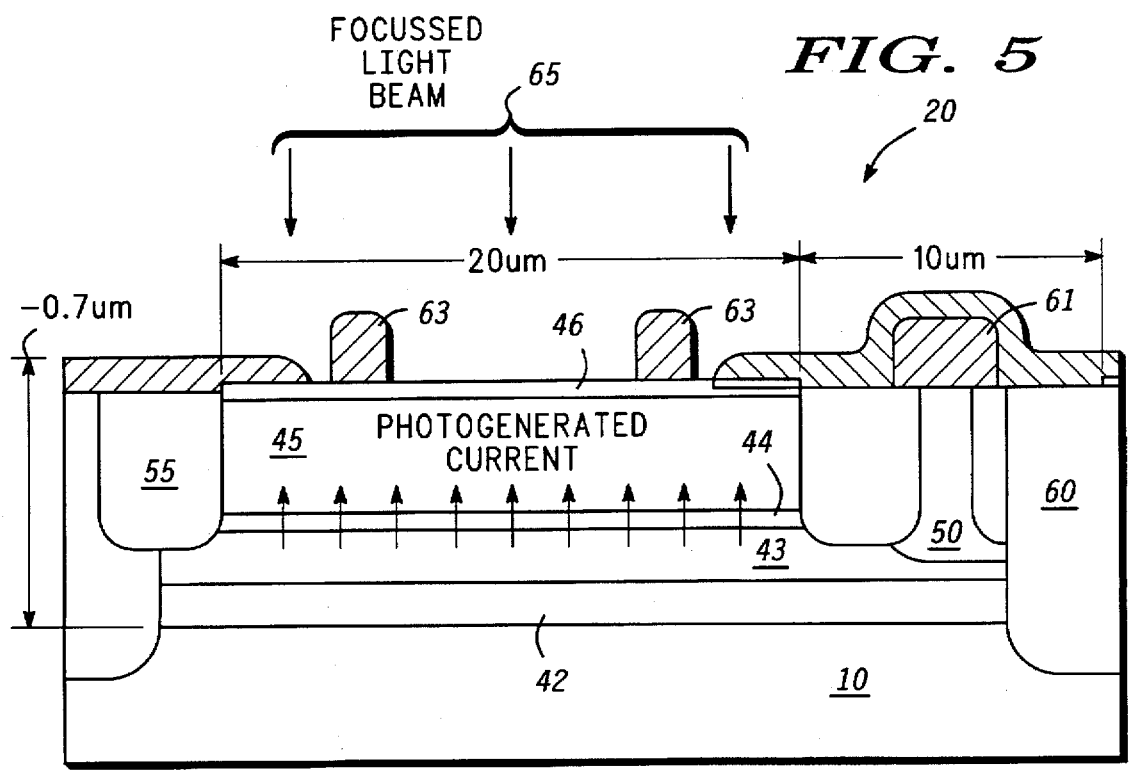
FIG. 5 is a simplified sectional view, portions thereof broken away, illustrating an embodiment of the apparatus of FIG. 1.

Referring specifically to FIG. 5, a cross-sectional view of a photodiode 20 fabricated on substrate 10, also having an array of LEDs formed thereon, is illustrated. A complete description of methods of fabrication and specific LED arrays is disclosed in copending U.S. patent application Ser. No. 08/240,055 filed May 9, 1994 and entitled Implanted LED Array and Method of Fabrication. This disclosure is incorporated herein by reference. Generally, the '055 disclosure allows the fabrication of photodiodes 20 on substrate 10 utilizing many of the same process steps. Thus, in general, no additional process steps are required.

In a specific example, substrate 10 is formed of undoped gallium arsenide (GaAs) to form a semi-insulating semiconductor. A conductive layer 42 is a relatively heavily doped layer of GaAs epitaxially grown on the surface of substrate 10. A carrier confinement layer 43 is an epitaxially grown layer of indium-gallium-aluminum-phosphide (InGaAlP) doped to provide N-type semiconductivity formed on conductive layer 42. An active layer 44 is an epitaxially grown layer of InGaAlP formed on confinement layer 43 in a manner well known in the art so that further description is believed to be unnecessary. A carrier confinement layer 45 is an epitaxially grown layer of InGaAlP doped to provide P-type semiconductivity and positioned on active layer 44. A cap layer 46, on confinement layer 45, is an epitaxially grown layer of GaAs heavily doped to provide P-type conductivity.

It will of course be understood that the various layers can be provided in many other forms and the present embodiment is disclosed because of the simplicity of formation. Also, in some embodiments additional layers are provided for various special applications and it should be understood that the disclosed structure is intended as a basic structure for purposes of this disclosure and not as a limitation.

A surface contact to conductive layer 42 is formed by converting a vertical pillar 50 of P-type semiconductive material in carrier confinement layer 45 and the material of active layer 44 to heavily doped N-type conductive material. The conversion is accomplished by implanting an impurity at the predetermined position of vertical pillar 50. A surface contact is provided for each photodiode 20 for each column and row, to reduce the resistance of the connections to the lower contact of each light emitting diode.

In a specific example, vertical pillars 50 are formed by using standard ion implant and implanting mask technology. Donor ions of silicon, Si+, are used but it will be understood that any known donor in this material system (e.g. Se, Te, etc.) could be utilized. Typically, manufacturing fabs are equipped with ion implanters having maximum accelerating voltages of 200 KeV. The projected range of doubly ionized Si ions at this energy is about 0.35 microns which limits the combined thickness of layers 45 and 44 to approximately 0.35 microns. It is, therefore, advantageous to remove the overlying portions of cap layer 46 prior to the implanting step to maximize the implant depth. The implant dose must be sufficient to convert pillars 50 down through layers 45 and 44 to a conductor. To accomplish the conversion, the implant dose, in one embodiment, is in the range of $10^{14}$ per $cm^2$. A photoresist layer (not shown) approximately 2.5 microns thick, formed into an implant mask in the usual manner, is sufficient to restrict the implant to vertical pillars 50.

Once the implant of vertical pillars 50 has been completed, the implant is activated with a high temperature anneal. Generally, because of the depth and dosage of the implant, the high temperature anneal requires a temperature in the range of approximately 800° C. to 900° C. The implant of vertical pillars 50 is generally a first step in the process sequence, because subsequent implant and metallization steps (to be explained) generally cannot tolerate this high temperature.

Confinement of each photodiode 20 is achieved by implanting impurity material to form an isolating resistive volume, or moat 55, around each defined photodiode 20. Resistive moat 55 laterally confines current flow across the P-N junction (carrier confinement layer 45, active layer 44 and carrier confinement layer 43) of each photodiode 20 and, therefore, defines the emitting region of each photodiode 20. The depth of moat 55 ranges from zero depth, in which only cap layer 46 is etched, to well into carrier confinement layer 43, depending upon the desired level of current confinement and the potential negative effects resulting from implanting through the P-N junction of photodiodes 20 (e.g. reliability issues). Corresponding implant energies range from 0 to approximately 200 KeV.

In a specific example, oxygen ions, O+, are utilized as the implanted impurity. It will be understood, however, that many other species including hydrogen (H+), boron (B+), etc. are known to produce resistive regions also. The implant dosage required for adequate isolation varies with the selected implant depth, but is typically in the range of $10^{12}$ to $10^{13}$ per $cm^2$. Generally, a photoresist layer approximately 2.0 microns thick, formed into an implant mask in the usual manner, is sufficient to restrict the implant to moat 55 surrounding each photodiode 20. It should be understood that cap layer 46 is generally removed to form exposed areas prior to this implant step because it is very difficult (there is no known implant process at this time) to make cap layer 46 highly resistive. As explained above, removal of cap layer 46 does not significantly effect the planarity of the structure because it is only approximately 500 angstroms thick. It should be noted that resistive moat 55 also acts to eliminate any parasitic, implanted P-N junctions at the interface between each photodiode 20 (P-type carrier confinement layer 45) and N-type vertical pillars 50.

It is generally necessary to isolate the photodiodes from array 11 to prevent crosstalk therebetween. In this specific embodiment the isolation is provided by an isolation implant 60 extending like a substantially continuous wall between each photodiode 20 and adjacent rows and columns of light emitting diodes. Implant 60 extends downwardly through carrier confinement layer 45, active layer 44, carrier confinement layer 43 and conductive layer 42 to electrically isolate photodiodes 20 from the adjacent array 11. In the specific embodiment illustrated, isolation implant 60 need only isolate the N-type layers (carrier confinement layer 43 and conductive layer 42) into rows, since resistive moat 55 isolates the P-type layers (carrier confinement layer 45 and active layer 44). In other embodiments, where resistive moat 55 is very thin vertically, it may be necessary that isolation implant 60 isolate P-type layers as well.

In a specific example, doubly ionized oxygen ions, O++, are used as the impurity because it allows a minimum implant mask thickness and oxygen implanted GaAs layers retain their resistive properties even after moderate temperature cycling. Since isolation implant 60 must extend through conductive layer 42, the depth range of isolation implant 60 limits the overall thickness of the structure (layers 42, 43, 44 and 45). Implant doses of approximately $10^{13}$ per cm$^2$ to $10^{14}$ per cm$^2$ have been found to be adequate for the required isolation. A photoresist mask about 3 microns thick is adequate for the isolation implant step.

An N metal contact 61 is formed on the surface of substrate 10 in contact with pillar 50 to serve as one terminal of photodiode 20. This contact is then connected, generally by the same surface metallization step, in a well known process, to either a row in array 11 or to column connection pad 22, 23. P metal contacts 63 are formed on cap layer 46 by surface metallization and these contacts are then connected, generally by the same metallization step, to either a column in array 11 or to row connection pad 25, 26. The above described fabrication process and structure is compatible with the fabrication process and structure described in the '055 disclosure cited above.

When the focused light beam, represented by arrows 65, is incident on the active region of photodiode 20, the light is absorbed in the layers near the surface (confinement layer 43) generating electron and hole pairs. The electron and hole pairs are separated by the electric field of the pn junction leading to a photocurrent which drives the LED pixel within array 11, as described previously.

Thus, new probing methods and apparatus have been disclosed for high resolution device arrays. The new and improved apparatus and testing methods for high resolution device arrays are relatively simple and inexpensive to manufacture and result in reliable, repeatable, high throughput on-wafer testing. Also, the new and improved apparatus and testing methods for high resolution device arrays are easily adaptable to automation. Further, the probing apparatus includes the fabrication of externally activated switches on the same substrate on which the device array is positioned. In at least some instances the switch fabrication process can be included in the fabrication process for the array and, therefore, does not require any additional process steps.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A high resolution device array with optical probe comprising:

a substrate;

an array of semiconductor devices formed in epitaxial layers grown on the substrate, the semiconductor devices each having two electrodes connected in rows and columns, and each row and column having an externally available I/O row pad and an externally available I/O column pad, respectively, for the connection of external input/output apparatus; and a plurality of externally activated semiconductor photodiodes formed on the substrate in the epitaxial layers, with one each of a first group of the plurality of semiconductor photodiodes having a first terminal connected to each of the I/O row pads of the rows of semiconductor devices and one each of a second group of the plurality of semiconductor photodiodes having a first terminal connected to each of the I/O column pads of the columns of semiconductor devices, the plurality of semiconductor photodiodes having a second terminal connected to externally available electrical connections and each semiconductor photodiode having a light input positioned to be externally accessible.

2. A high resolution device array with optical probe as claimed in claim 1 wherein each of the plurality of externally activated semiconductor photodiodes has a first terminal and a second terminal, each I/O pad for each row of the devices has the first terminal of a different one of the plurality of semiconductor photodiodes connected thereto, each I/O pad for each column of the devices has the first terminal of a different one of the plurality of semiconductor photodiodes connected thereto, the second terminal of each semiconductor photodiode connected to the I/O pads for the rows are connected together and to an externally available connection pad, and the second terminal of each semiconductor photodiode connected to the I/O pads for the columns are connected together and to an externally available connection pad.

3. A high resolution device array with optical probe as claimed in claim 2 including in addition an external power source connected to the externally available electrical connections.

4. A high resolution device array with optical probe as claimed in claim 3 wherein the external power source provides sufficient power to operate one of the plurality of devices.

5. A high resolution device array with optical probe as claimed in claim 1 wherein each device in the array of devices includes a light emitting device.

6. A high resolution device array with optical probe as claimed in claim 5 wherein the light emitting device is a semiconductor diode.

7. A high resolution device array with optical probe comprising:

a semiconductor substrate;

an array of semiconductor devices formed on the semiconductor substrate, the semiconductor devices being positioned in rows and columns with each row having a row bus connected to all of the semiconductor devices in the row and each column having a column bus connected to all of the semiconductor devices in the column, and each row bus and column bus having an externally available I/O row pad and an externally available I/O column pad, respectively, for the connection of external input/output apparatus;

a first plurality of optically activated semiconductor diodes formed on the semiconductor substrate, each of the first plurality of optically activated semiconductor diodes having first and second terminals, and one each of the first terminals of the first plurality of optically activated semiconductor diodes being connected to one each of the I/O row pads of the row buses so that each of the rows of semiconductor devices is coupled to a different one of the first plurality of optically activated semiconductor diodes, each of the second terminals of the first plurality of optically activated semiconductor diodes being connected together and to an externally available row connection pad positioned on the semiconductor substrate; and a second plurality of optically activated semiconductor diodes formed on the semiconductor substrate, each of the second plurality of optically activated semiconductor diodes having first and second terminals, and one each of the first terminals of the second plurality of optically activated semiconductor diodes being coupled to one each of the I/O column pads of the column buses so that each of the columns of semiconductor devices is coupled to a different one of the second plurality of optically activated semiconductor diodes, each of the second terminals of the second plurality of optically activated semiconductor diodes being connected together and to an externally available column connection pad positioned on the semiconductor substrate.

8. A high resolution device array with optical probe as claimed in claim 7 wherein each of the plurality of devices includes one of a Schottky photodiode, a pn photodiode, or a photoconductive device.

9. A high resolution device array with optical probe as claimed in claim 8 wherein the array of devices are formed in epitaxial layers grown on the substrate and each of the light activated devices includes a photodiode formed in the same epitaxial layers.

10. A high resolution device array with optical probe as claimed in claim 9 wherein each device in the array of devices includes a light emitting device.

11. A high resolution device array with optical probe as claimed in claim 10 wherein the light emitting device is a semiconductor diode.

12. A method of probing high resolution device arrays comprising the steps of:

providing a semiconductor substrate and fabricating an array of semiconductor devices thereon, the semiconductor devices being positioned in rows and columns, and each row and column having an externally available I/O row pad and an externally available I/O column pad, respectively, for the connection of external input/output apparatus;

fabricating a first plurality of externally activated semiconductor switches each having first and second terminals on the semiconductor substrate and connecting one each of the first terminals of the first plurality of semiconductor switches to each of the I/O row pads of the rows and fabricating a second plurality of externally activated semiconductor switches each having first and second terminals on the semiconductor substrate and connecting one each of the first terminals of the second plurality of semiconductor switches to each of the I/O column pads of the columns of semiconductor devices, the second terminals of the first and second pluralities of semiconductor switches having externally available electrical connections and each semiconductor switch having an external energy input positioned to be externally accessible;

connecting the second terminals of the first plurality of externally activated semiconductor switches into a row circuit and connecting the second terminals of the second plurality of externally activated semiconductor switches into a column circuit and connecting the row circuit and the column circuit into a complete probe circuit;

addressing and activating the semiconductor devices in the array by directing an external activating energy source onto the externally activated semiconductor switches in the row and column circuits to determine the existence of inoperative semiconductor devices in the array of semiconductor devices: and disconnecting the complete probe circuit from the row and column circuits and connecting the I/O pads to external input/output apparatus.

13. A method as claimed in claim 12 wherein the step of connecting the row circuit and the column circuit into a complete probe circuit includes connecting a current source capable of providing sufficient current to operate one of the plurality of devices into the probe circuit and the step of addressing and activating the devices in the array includes addressing and activating each device in the array, one at a time, by directing an external activating energy source onto each externally activated switch in the row circuits, one at a time, and simultaneously directing an external activating energy source onto each externally activated switch in the column circuits, one at a time.

14. A method as claimed in claim 13 wherein the step of addressing and activating the devices in the array includes determining the amount of current flowing in each device of the array.

15. A method as claimed in claim 13 wherein the step of providing the substrate with the array of devices includes providing an array in which each device in the array of devices includes a light emitting device and the step of addressing and activating the devices in the array includes activating the device array to produce at least one test pattern.

16. A method of optically probing high resolution device arrays comprising the steps of:

providing a semiconductor substrate with an array of semiconductor devices formed thereon, the semiconductor devices being positioned in rows and columns with each row having a row bus connected to all of the semiconductor devices in the row and each column having a column bus connected to all of the semiconductor devices in the column, and each row bus and column bus having an externally available I/O row pad and an externally available I/O column pad, respectively, for the connection of external input/output apparatus;

fabricating a first plurality of optically activated semiconductor switches on the semiconductor substrate, each of the first plurality of optically activated semiconductor switches having first and second terminals, and coupling one each of the first terminals of the first plurality of optically activated semiconductor switches to one each of the I/O row pads of the row buses so that each of the rows of semiconductor devices is coupled to a different one of the first plurality of optically activated semiconductor switches, and connecting each of the second terminals of the first plurality of optically activated semiconductor switches together and to an externally available row connection pad positioned on the semiconductor substrate; and fabricating a second plurality of optically activated semiconductor switches on the semiconductor substrate, each of the second plurality of optically activated semiconductor switches having first and second terminals, coupling one each of the first terminals of the second plurality of optically activated semiconductor switches to one each of the I/O column pads of the column buses so that each of the columns of semiconductor devices is coupled to a different one of the second plurality of optically activated semiconductor switches, and connecting each of the second terminals of the second plurality of optically activated semiconductor switches together and to an externally available column connection pad positioned on the semiconductor substrate;

connecting a complete power source and return circuit between the row and column connection pads; and addressing and activating the semiconductor devices in the array by directing an external activating light source onto the optically activated semiconductor switches in the row and column to determine the existence of inoperative semiconductor devices in the array of semiconductor devices: and disconnecting the complete power source and return circuit from the row and column connection pads and connecting the I/O pads to external input/output apparatus.

17. A method as claimed in claim 16 wherein the step of addressing and activating each semiconductor device in the array includes addressing and activating each semiconductor device in the array, one at a time, by directing an external activating light source onto each optically activated semiconductor switch in the row one at a time, and simultaneously directing an external activating light source onto each optically activated semiconductor switch in the column, one at a time.

18. A method as claimed in claim 17 wherein the step of addressing and activating the devices in the array includes determining the amount of current flowing in each device of the array.

19. A method as claimed in claim 16 wherein the step of addressing and activating each device in the array includes simultaneously addressing and activating all rows in the array by directing an external activating light source onto each optically activated semiconductor switch in the row, and simultaneously directing an external activating light source onto each optically activated semiconductor switch in the column, one at a time.

* * * * *